(12) United States Patent
Taniguchi

(10) Patent No.: US 12,727,424 B2
(45) Date of Patent: Sep. 1, 2026

(54) OPTICAL HEATING DEVICE

(71) Applicant: Ushio Denki Kabushiki Kaisha, Tokyo (JP)

(72) Inventor: Shinji Taniguchi, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 937 days.

(21) Appl. No.: 17/751,249

(22) Filed: May 23, 2022

(65) Prior Publication Data

US 2022/0392787 A1 Dec. 8, 2022

(30) Foreign Application Priority Data

Jun. 7, 2021 (JP) ................................ 2021-095234

(51) Int. Cl.
*H10P 72/00* (2026.01)
*G02F 1/01* (2006.01)
*H05B 47/105* (2020.01)

(52) U.S. Cl.
CPC ........ *H10P 72/0436* (2026.01); *G02F 1/0147* (2013.01); *H05B 47/105* (2020.01); *H10P 72/0602* (2026.01)

(58) Field of Classification Search
CPC .... G02F 1/0147; G02F 1/01; H01L 21/67115; H01L 21/67248; H01L 21/67; H05B 3/0047; H05B 3/0061; H05B 47/105
See application file for complete search history.

(56) References Cited

U.S. PATENT DOCUMENTS 6,876,816 B2 * 4/2005 Shigeoka .......... H01L 21/67115 118/724
2017/0226639 A1 * 8/2017 Yamaga .................. C23C 16/46

FOREIGN PATENT DOCUMENTS

JP 2016-58722 A 4/2016
WO 2016/039199 A1 3/2016

* cited by examiner

*Primary Examiner* — Woody A Lee, Jr.
*Assistant Examiner* — Adam M Eckardt
(74) *Attorney, Agent, or Firm* — Yoshida & Associates LLC; Kenichiro Yoshida

(57) ABSTRACT

An optical heating device includes a heating light source unit having a plurality of planar light source areas in each of which a light source is arranged, and a controller configured to control light output of the light source. The controller includes a storage section that stores temperature distribution characteristic information describing a relation between a relative ratio of the light output of each light source and temperature distribution on a main surface of a tabular test piece, when light from the heating light source unit is irradiated toward the tabular test piece; and an output controller that changes a ratio of the light output based on the temperature distribution characteristic information, in order to bring the temperature distribution of a main surface of an object to be heated obtained when the light is irradiated under a predetermined light output for distribution measurement closer to a desired temperature distribution.

14 Claims, 8 Drawing Sheets

1
10
20
30
31
31
32
33
3
3a
L1
L2
41
Central Location
Outside of the Central Location
Z
X
Y

OPTICAL HEATING DEVICE

CROSS-REFERENCE TO RELATED APPLICATION(S)

This application claims priority from Japanese Patent Application No. 2021-095234. The entire teachings of the above application are incorporated herein by reference.

TECHNICAL FIELD

The present invention relates to an optical heating device.

BACKGROUND ART

Semiconductor manufacturing processes involve various heat treatments including film forming treatment, oxidation diffusion treatment such, modification treatment, and annealing treatment on workpieces, such as semiconductor wafers. As a method to perform these heat treatments, optical heating, which enables non-contact treatment, is generally employed. For example, Patent Document 1 below discloses a heat treatment device for performing heat treatment of silicon wafers by irradiating the surface to be treated of a semiconductor wafer with heating light.

CITATION LIST

Patent Document

Patent Document 1: JP-A-2016-058722

SUMMARY OF THE INVENTION

The characteristics and appearance of semiconductor devices that have been fabricated may be influenced by the temperature during their heating. In particular, from a viewpoint of suppressing the variation of characteristics among devices, the heat treatment of semiconductor wafers is expected to heat the entire wafer uniformly.

The heating light source is constituted by arranging a plurality of light sources that are composed of halogen lamps or LED elements, in a position facing away from a main surface of an object to be heated (a wafer in the above example). However, a temperature distribution on the main surface of the object to be heated will not be uniform when each of the light sources is simply lit with the same light output. This is because the heating light is likely to be concentrated near the center of the main surface of the object to be heated, while the irradiance near the circumferential edge portion is likely to be lower than that near the center.

In consideration of this tendency, for example, a method is considered such that the output of the light source located at a position facing the near center of the main surface of the object to be heated is controlled to be lower than the output of the light source facing the area outside of the near center. However, a uniform temperature distribution is unlikely to be obtained by simply reducing the output of the light source closest to the center among the plurality of light sources that constitute the heating light source. This is because the light from each of the light sources reaches an irradiated surface of the object to be heated with a predetermined divergence angle.

The main surface of the object to be heated is heated by light from multiple light sources that are superimposed on the surface thereof. In other words, each area on the main surface of the object to be heated is heated under the heating conditions achieved by light and heat from multiple light sources interacting with each other to determine its temperature. In other words, in the case in which the temperature of a specific area R1 on the main surface of the object to be heated needs to be lowered to be closer to the temperature of another area Rj, it may not be enough to simply lower the output of the light sources (group) Q1 located at the point corresponding to the area R1 than the output of the light sources (group) Qj located at the point corresponding to the area Rj. This is because when the output of the light sources (group) Q1 is decreased, the temperature of the area R2 adjacent to the area R1 on the main surface of the heated object is also lowered.

When the output of the light source Q2 that is adjacent to the light source Q1, is increased to raise the temperature of the area R2, the temperature of the area R1 also rises along with this increase in output.

The temperature distribution also tends to be affected by the individual characteristics of the object to be heated. For example, even though the object to be heated is a semiconductor silicon wafer, the surface condition of each silicon wafer may be slightly different from each other.

Under these circumstances, in reality, the temperature distribution of the object to be heated is made uniform by adjusting the light output of each light source based on the experience and intuition of an operator (user) after measuring the temperature distribution of the object to be heated.

In view of the above problem, it is an object of the present invention to provide an optical heating device capable of automatically adjusting the temperature distribution of an object to be heated with high accuracy.

An optical heating device of the present invention is an optical heating device for heating a tabular object to be heated, the optical heating device includes:

- a heating light source unit having a plurality of planar light source areas in each of which at least a light source is arranged, in a direction along a light source surface on which the light source areas are configured;
- a controller configured to control light output of the light source located in each of the light source areas per light source area;

the controller includes

- a storage section that stores temperature distribution characteristic information describing a relation between a relative ratio of the light output of each light source among the plurality of light source areas and temperature distribution along a surface direction of a main surface of a tabular test piece, and desired temperature distribution information describing desired temperature distribution in the surface direction of a main surface of the object to be heated, when light from the heating light source unit is irradiated toward the tabular test piece placed with a predetermined separation distance from the light source areas with respect to a direction orthogonal to the light source surface;
- an input receiving section that receives an input of measured temperature distribution information describing temperature distribution in the surface direction of the main surface of the object to be heated, the measured temperature distribution information being obtained when light from the heating light source unit is irradiated onto the object to be heated in a state in which light output of the light source is set to a predetermined light output for distribution measurement in each of the light source areas; and
- an output controller that changes a ratio of the light output of each light source among the plurality of light source areas based on the temperature distribution characteristic information, in order to bring the temperature distribution described in the measured temperature distribution information closer to the temperature distribution described in the desired temperature distribution information.

The above optical heating device automatically enables the temperature distribution of the object to be heated to be made to the desired temperature distribution, for example, with the following procedure.

Firstly, the heating light source unit irradiates the object to be heated with light in the state in which the light output of the light source is set to a predetermined light output for distribution measurement. The information on the temperature distribution of the main surface of the object to be heated (measured temperature distribution information) obtained at this time is input to the controller from the input receiving section. The light output for distribution measurement is set, for example, to be the same output value for the light sources in all light source areas. For a more specific example, the output of the light source located in all light source areas is set to 10% of the maximum output.

The optical heating device itself may be provided with a function to measure the temperature distribution of the main surface of the object to be heated, i.e., a first thermometer. Examples of the first thermometer suitably used include thermocouples, radiation thermometers, and thermal cameras. From the viewpoint of accurately measuring the temperature distribution, thermocouples are suitably used. From the viewpoint of simply measuring the temperature distribution, thermal cameras are suitably used.

The storage section provided in the controller stores the temperature distribution characteristic information. The temperature distribution characteristic information is information that has been measured in advance using the tabular test piece. The temperature distribution characteristic information may have been obtained in advance and stored in the storage section before the optical heating device is shipped.

The temperature distribution characteristic information is information that describes a relation between the relative ratio of the light output of the light source among the respective light source areas and the temperature distribution in the surface direction of the tabular test piece when light from the heating light source unit (each of the light source areas) is irradiated onto the test piece in a state that the test piece is disposed with a predetermined separation distance from the light source areas to face the light source areas. More specifically, the information is as follows.

The heating light source unit is assumed to have n light source areas Xi (i=1, . . . , n). As described above, each of the light source areas Xi is composed of one or more light sources. The heating light source unit is configured to be capable of controlling the light output of the light sources contained in the respective light source areas Xi per light source area Xi.

The tabular test piece is placed at a predetermined position and irradiated with the heating light under different irradiation conditions by changing the light output Pi (i=1, . . . , n) of the light sources belonging to the respective light source areas Xi (i=1, . . . , n) respectively. Then, the temperature distribution on the main surface of the test piece under each of the irradiation conditions is then measured. The temperature distribution is, for example, information that associates a plurality of locations on the main surface of the test piece, which are specified in polar or Cartesian coordinate format, with the temperature at those locations. In addition to specifying with the form of coordinates, the temperature distribution may also be information that, after dividing the main surface of the test piece into multiple areas, associates the temperature with each area.

For example, the temperature distribution can be measured while varying the light output Pi of the light sources contained in each light source area Xi from the minimum output (0% output) to the maximum output (100% output) by 10% increments, that is, while varying the light output Pi in 11 kinds. To give a more specific example, when the number of light source areas Xi is seven (n=7), this measurement provides data on $11^7$ kinds of temperature distribution characteristics. In other words, when the number of Xi is n and the light output Pi of the light sources contained in each light source area Xi varies in m kinds between the minimum output and the maximum output, $m^n$ kinds of the temperature distribution characteristic information is obtained. Such temperature distribution characteristic information is stored in the storage section of the controller.

The storage section provided in the controller stores information about the temperature distribution of the main surface of the object to be heated (desired temperature distribution information), which is desired by a user. As described above, when the object to be heated with the optical heating device is a semiconductor wafer, uniformity of temperature distribution in the surface direction is usually necessary, hence the storage section may be configured to have stored the desired temperature distribution information in advance.

In other words, the desired temperature distribution information may be information indicating that the main surface of the object to be heated has a substantially uniform temperature distribution in a surface direction thereof. The term "substantially uniform temperature distribution" here means that the temperature variation at each position of the main surface of the object to be heated can be accepted as almost nonexistent, and typically means that when the average temperature at each location on the main surface of the object to be heated is used as a reference, the temperature at each location is controlled to a variation range of ±10% of the average value.

Another example involves a case in which a user does not seek a completely uniform temperature over the entire main surface of the object to be heated, but instead desires to have the temperature at a certain point relatively higher than the surrounding area. For such a case, the desired temperature distribution information that is input by the user may be imported into the controller via the input receiving section and stored in the storage section.

The output controller provided in the controller compares the information on the temperature distribution of the main surface of the object to be heated (measured temperature distribution information) obtained when the light is irradiated from the heating light source unit to the object to be heated in the state of setting the light output for distribution measurement described above, with the desired temperature distribution information stored in the storage section. Then, the relative ratio of the light output Pi of the light sources contained in each light source area Xi is varied to bring the temperature distribution indicated by the measured temperature distribution information closer to the temperature distribution indicated by the desired temperature distribution information. The relative ratio is determined by using the temperature distribution characteristic information stored in the storage section.

As described above, the temperature distribution characteristic information describes how the temperature distribution of the main surface of the test piece varies with varying the light output of the light sources contained in each light source area Xi (i=1, . . . , n) in various ways. Hence, comparing the temperature distribution obtained under the light output for distribution measurement (measured temperature distribution information) with the temperature distribution described in the desired temperature distribution information makes it possible to recognize how the ratios of light output among the respective light source areas Xi (i=1, . . . , n) are to be varied in order to reduce the discrepancy between the two temperature distributions. Therefore, having the output controller automatically perform the above calculation and adjust the relative ratio of the light output of the respective light source areas Xi (i=1, . . . , n) based on the calculation results makes it possible to change the temperature distribution on the main surface of the object to be heated to the temperature distribution desired by the user (e.g., the temperature distribution with high uniformity) without relying on the user's experience or intuition.

Once the temperature distribution of the main surface of the object to be heated has been adjusted to the desired temperature distribution, the object to be heated can be raised to the target temperature by increasing the light output of the respective light source areas Xi (i=1, . . . , n) or adjusting the heating time, while maintaining the relative ratio of the light output of the respective light source areas Xi (i=1, . . . , n).

In other words, after adjusting a ratio of the light output of each light source among the plurality of light source areas to allow the discrepancy between the temperature distribution described in the measured temperature distribution information and the temperature distribution described in the desired temperature distribution information to become equal to or less than a threshold value, the output controller may control the light output of the light source areas to increase from the light output for distribution measurement while maintaining the ratio.

For example, after the temperature of a specific part of the object to be heated is measured, the output controller may increase the light output of the respective light source areas Xi (i=1, . . . , n) to reach the target temperature while maintaining the relative ratio of the light output of the light sources contained in the respective light source areas Xi (i=1, . . . , n).

The light source areas may include at least a first area that includes a central location of the light source surface and a second area that is located outside of the first area.

In this case, the second area may be further divided into the plurality of light source areas along a circumferential direction of the light source surface.

In particular, the circumferential edge portion of the object to be heated is likely to be cooler than the central portion, and the circumferential edge portion has a larger area than the central portion. The above configuration enables finer control of the temperature near the circumferential edge portion.

The controller may perform processes in sequence. The processes include:

- a first process in which the output controller turns on the light source when the object to be heated is placed, in a state in which the light output of the light source is set to the light output for distribution measurement;
- a second process in which the measured temperature distribution information is obtained by measuring the temperature distribution in the surface direction of the main surface of the object to be heated at a time of executing the first process; and
- a third process in which the output controller varies the ratio of the light output of each light source among the plurality of light source areas in order to bring the temperature distribution described in the measured temperature distribution information closer to the temperature distribution described in the desired temperature distribution information, based on the temperature distribution characteristic information that has been loaded from the storage section, after executing the second process.

In addition, the optical heating device may be provided with a second thermometer that measures a temperature at a specific point on the main surface of the object to be heated, the input receiving section may be configured to receive an input of information regarding a target temperature of the main surface of the object to be heated, the third process may be a process in which the output controller adjusts the ratio of the light output of each light source among the plurality of light source areas in order to allow the discrepancy between the temperature distribution described in the measured temperature distribution information and the temperature distribution described in the desired temperature distribution information to be equal to or less than the threshold value, and the output controller is, after executing the third process, configured to execute a fourth process of increasing the light output of the plurality of light source areas from the light output for distribution measurement while maintaining the ratio adjusted in the third process in order to allow the temperature information indicated with the second thermometer to reach the target temperature.

The optical heating device of the present invention makes it possible to accurately and automatically adjust the temperature distribution of the object to be heated, without relying on the user's experience or intuition.

BRIEF DESCRIPTION OF DRAWINGS

FIG. 6B is a conceptual diagram of the simulation model of the heating light source unit, with the hatched area in FIG. 6*a* marked with signs.

DETAILED DESCRIPTION OF THE EMBODIMENTS

Hereinafter, embodiments of an optical heating device according to the present invention will now be described with reference to the drawings. It is noted that each of the following drawings related to the optical heating device is merely schematically illustrated. The dimensional ratios and the number of parts on the drawings do not necessarily match the actual dimensional ratios and the actual number of parts.

Figure 1:
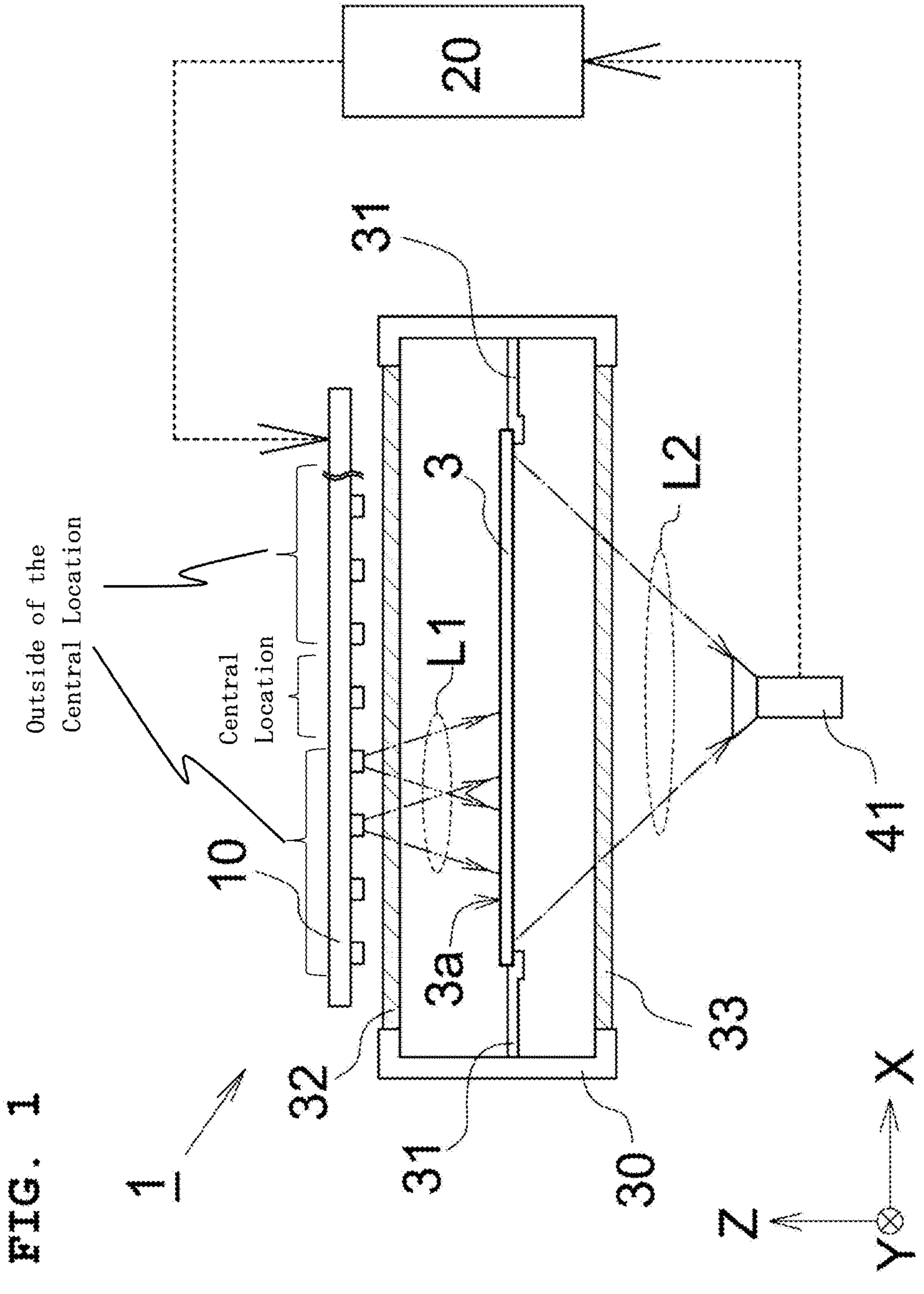
FIG. 1 is a schematic cross-sectional view illustrating an embodiment of an optical heating device of the present invention.

FIG. 1 is a schematic view illustrating the configuration of an optical heating device. The optical heating device 1 shown in FIG. 1 is provided with a heating light source unit 10 including a plurality of light sources, and a controller 20 that controls the light output of the light sources provided in the heating light source unit 10.

The optical heating device 1 of the present embodiment is provided with a chamber 30 that accommodates an object to be heated 3. Upon the use of the optical heating device 1, heating light L1 is emitted from the heating light source unit 10 while the object to be heated 3 is placed at a predetermined location in the chamber 30. This allows the heating light L1 to be irradiated to the main surface 3*a* of the object to be heated 3, heating the object to be heated 3.

In the following explanation, as shown in FIG. 1, the X-Y-Z coordinate system is appropriately used to represent a direction of separation between the heating light source unit 10 and the object to be heated 3 as the Z direction, and a plane orthogonal to the Z direction as the XY plane. When the direction is expressed, a positive or negative sign is assigned to distinguish a positive direction from a negative direction, such as "+Z direction" and "−Z direction". In the case of expressing the direction without distinguishing a positive direction from a negative direction, it is simply expressed as "Z direction". With this expression, the heating light L1 emitted from the heating light source unit 10 travels in the −Z direction and irradiates the main surface 3*a* of the object to be heated 3, heating the object to be heated 3. The main surface 3*a* of the object to be heated 3 is a plane parallel to the XY plane.

The object to be heated 3 is typically a silicon wafer. However, the optical heating device 1 of the present embodiment can be applied to the heat treatment of the object to be heated 3 other than silicon wafers, for example, glass substrates, ceramic substrates, ALTIC (alumina titanium carbide) substrates, and SiC (silicon carbide) substrates.

The heating light source unit 10 is provided with a plurality of light sources. In more detail, the heating light source unit 10 is composed of a plurality of light sources arranged along a plane parallel to the XY plane. The light sources are configured to allow their light output to be controllable in a predetermined unit (hereinafter referred to as the "light source area"). This point will be discussed later with reference to FIGS. 3 and 4.

In the present embodiment, the light source mounted on the heating light source unit 10 is configured as a halogen lamp. However, the light source can be a solid-state light source, such as an LED element, or a lamp other than a halogen lamp. In the former case, more specifically, the light source may be an LED element having a peak wavelength of 365 nm to 480 nm. The LED element typically has a peak wavelength of 395 nm.

In the example shown in FIG. 1, the chamber 30 is provided with supporters 31 for supporting the object to be heated 3. The supporters 31 can be of any structure as long as it is capable of supporting the main surface 3*a* of the object to be heated 3 in a state that allows the main surface 3*a* to be substantially parallel to a surface of the arrangement of the light sources mounted in the heating light source unit 10.

In the example shown in FIG. 1, the chamber 30 is provided with a window 32 and a window 33. The window 32 is a light-transmissive window to allow the heating light L1 emitted from the heating light source unit 10, which is located outside the chamber 30, to travel into the chamber 30. The window 33 is an observation window for measuring the temperature distribution of the object to be heated 3 with a thermal camera 41. In more detail, the thermal camera 41 measures the temperature distribution of the main surface 3*a* of the object to be heated 3 by receiving infrared light L2 emitted from the object to be heated 3. In this example, the thermal camera 41 corresponds to the "first thermometer".

As described below, the first thermometer represented by the thermal camera 41 can be used to measure the temperature distribution along the XY plane of the main surface 3*a* of the object to be heated 3 when each of the light sources of the heating light source unit 10 is lit under the predetermined light output conditions. From this viewpoint, thermocouples and radiation thermometers can also be used as the first thermometer, other than the thermal camera 41. In these cases, the temperature distribution of the main surface 3*a* of the object to be heated 3 can be obtained by measuring the temperature at a plurality of positions distributed on the main surface 3*a* of the object to be heated 3.

The controller 20 receives the information on the temperature distribution of the main surface 3*a* of the object to be heated 3, obtained by the thermal camera 41. The controller 20 controls the output of each of the light sources of the heating light source unit 10 based on the information of the temperature distribution. The configuration and processing contents of the controller 20 will be described later with reference to FIGS. 5 and 8.

As will be described later, this light heating system 1 is not configured to have a feedback control on the output of the respective light sources of the heating light source unit 10 based on the information of the temperature distribution of the main surface 3*a* of the object to be heated 3. Hence, since a fast response is not required, the thermal camera 41 can be used as a means of measuring the temperature distribution of the main surface 3*a* of the object to be heated 3.

Figure 2:
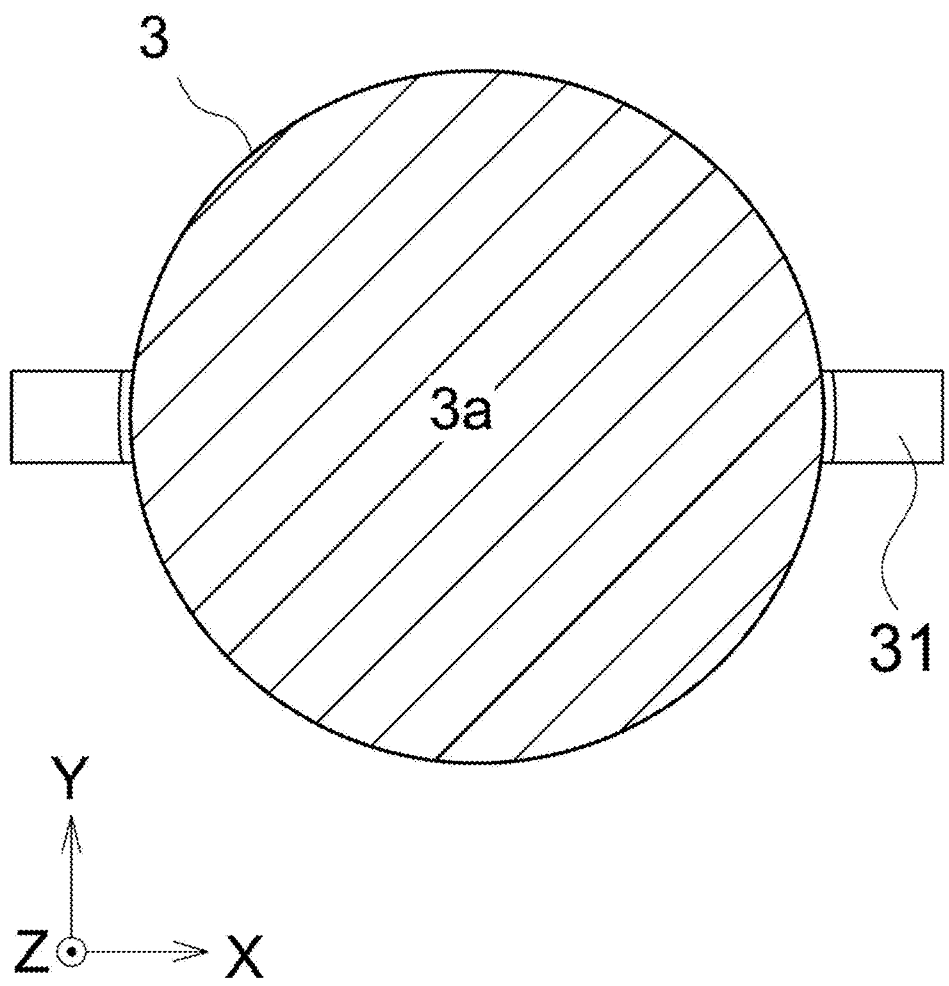
FIG. 2 is a plan view of an object to be heated 3 in FIG. 1 when viewed from the +Z side.

FIG. 2 is a plan view of the object to be heated 3 when viewed from the +Z side. In the example shown in FIG. 2, the object to be heated 3 has a circular the main surface 3*a*. However, the main surface 3*a* is not limited to a circular shape, and may be an oval or polygonal shape.

Figure 3:
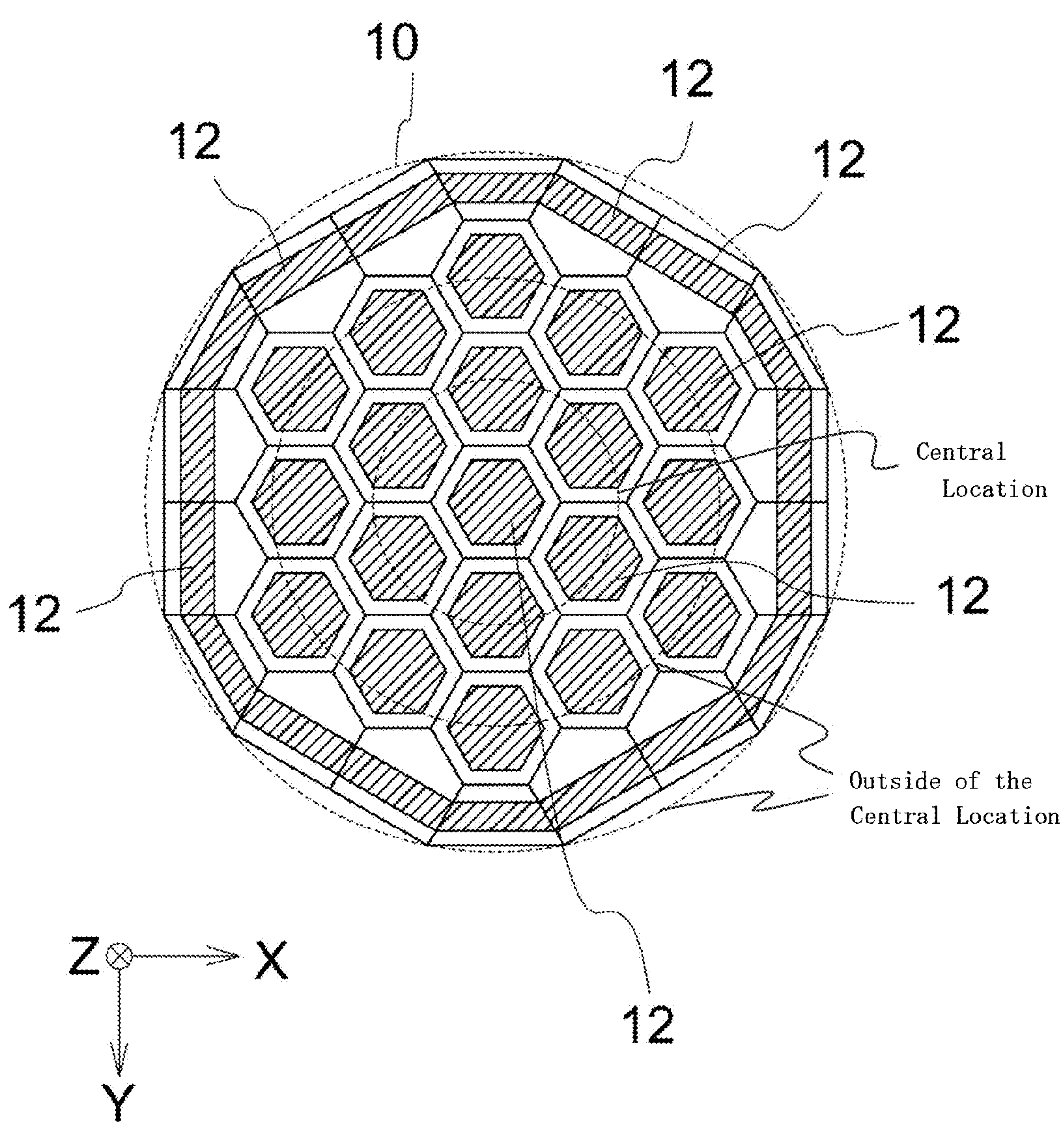
FIG. 3 is a schematic plan view illustrating the configuration of a heating light source unit 10 in FIG. 1.
Figure 4:
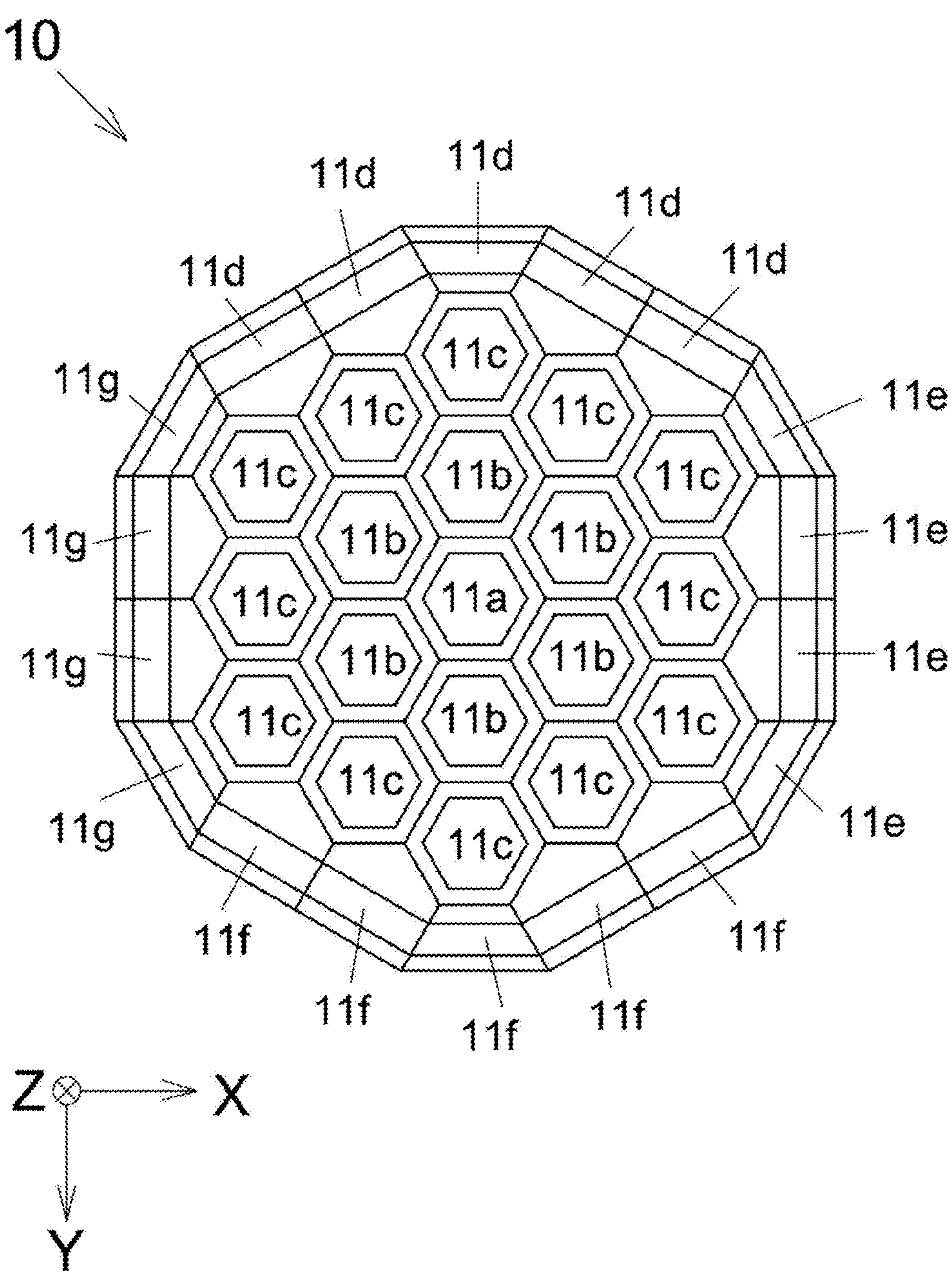
FIG. 4 is a drawing that simplifies the drawing in FIG. 3 for illustrative purposes and adds signs.

FIGS. 3 and 4 are plan views schematically illustrating the configuration of the heating light source unit 10, and are viewed from the side of the object to be heated 3 in the +Z direction. In the example shown in FIG. 3, there are 37 light sources 12 arranged along the XY plane. As shown in FIG. 4, these light sources 12 provided in the heating light source unit 10 are divided into seven light source areas 11 (11*a*, 11*b*, 11*c*, 11*d*, 11*e*, 11*f*, 11*g*). The number of light sources 12 and light source areas 11 may be any number.

The light source area 11*a* is located approximately at the center of the light source surface (plane along the XY plane) of the heating light source unit 10, and includes one light source 12 in this case. The light source areas 11*b* are located in the area surrounding the light source area 11*a*, and include six light sources 12 in this case. The light source areas 11*c* are located in the area surrounding the light source areas 11*b*, and include 12 light sources 12 in this case.

A group of light source areas 11*d*, 11*e*, 11*f*, 11*g* is located in the area surrounding the light source areas 11*c*. These groups are separated into four light source areas (11*d*, 11*e*, 11*f*, 11*g*) in the circumferential direction. The light source areas 11*d* and the light source areas 11*f* each include five light sources 12, and the light source areas 11*e* and the light source areas 11*g* each include four light source areas 12.

As described above, the controller 20 is configured to be capable of controlling the light output of each light source 12 mounted on the heating light source unit 10 per light source area 11. Hereinafter, the configuration and control details of the controller 20 will be described.

Figure 5:
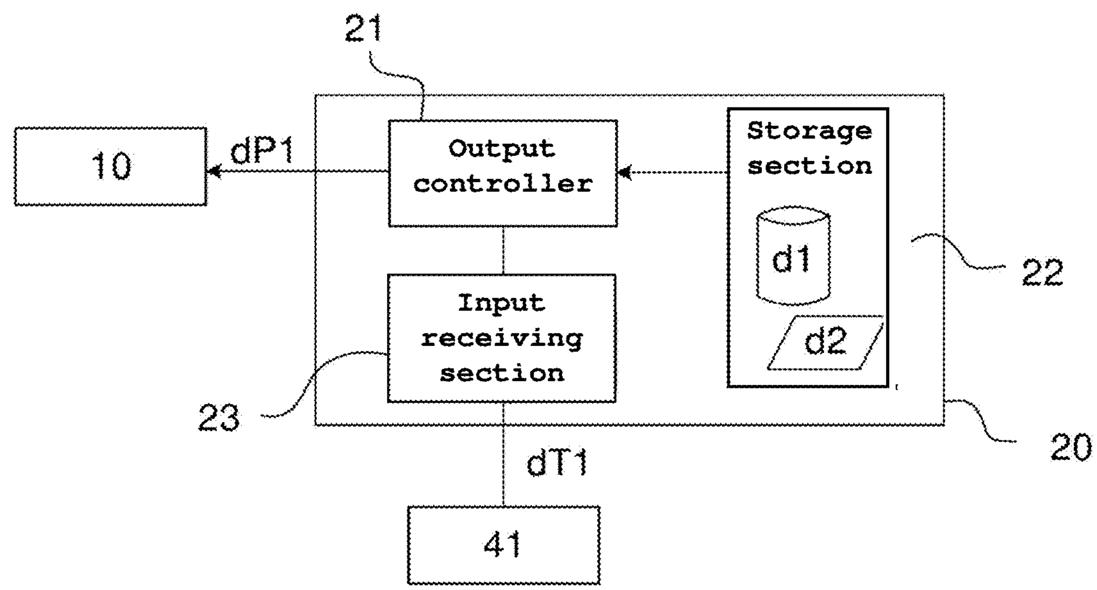
FIG. 5 is a block diagram schematically illustrating the configuration of a controller 20 in FIG. 1.

FIG. 5 is a block diagram schematically illustrating the configuration of the controller 20. The controller 20 is provided with an output controller 21, a storage section 22, and an input receiving section 23.

The input receiving section 23 is an interface that receives information from outside the controller 20. In more detail, the input receiving section 23 receives information on the temperature distribution of the main surface of the object to be heated 3 measured by the thermal camera 41 (hereinafter referred to as "measured temperature distribution information dT1").

The storage section 22 is a storage medium for storing various types of information, such as typically a hard disk or a flash memory. The storage section 22 stores temperature distribution characteristic information d1 and desired temperature distribution information d2.

The desired temperature distribution information d2 is information on the temperature distribution of the main surface 3*a* of the object to be heated 3 that a user of the optical heating device 1 desires to achieve. When the object to be heated 3 is a silicon wafer, the main surface 3*a* of the object to be heated 3 is typically desired to be heated uniformly. In this case, the desired temperature distribution information d2 contains information indicating a uniform temperature distribution regardless of the coordinate position on the XY plane. In this case, the desired temperature distribution information d2 may be assumed to have been stored in the storage section 22 in advance, prior to being used by the user.

As another example, a situation depending on the side of the user involves a case in which a user does not seek a completely uniform temperature over the entire main surface of the object to be heated, but instead desires to have the temperature at a certain point relatively higher than the surrounding area. In such a case, the user inputs the desired temperature distribution information d2 to the controller 20 using a terminal or other device, and this desired temperature distribution information d2 is entered into the controller 20 via the input receiving section 23 and stored in the storage section 22.

The temperature distribution characteristic information d1 is information obtained in advance using a tabular test piece at a time before the optical heating device 1 is delivered to the user, typically before shipment. This temperature distribution characteristic information d1 describes the state of variation of the temperature distribution on the main surface of the tabular test piece when the output of the light source 12 mounted on the heating light source unit 10 varies while the tabular test piece is placed at a predetermined separation distance in the Z direction from the heating light source unit 10. At this time, the output of the light source 12 changes per light source area 11.

To be more specific with reference to the example in FIG. 4, the temperature distribution characteristic information d1 corresponds to the information about the temperature distribution of the main surface of the test piece measured while gradually changing the light output of the light sources included in all of the light source areas 11 (11*a*, 11*b*, . . . , 11*g*). In other words, the temperature distribution characteristic information d1 is capable of providing information that how much the temperature distribution of the main surface of the test piece is influenced by changing the light output of which light source areas 11.

Figure 6A:
FIG. 6A is a conceptual diagram of the simulation model of a heating light source unit.
Figure 6A:
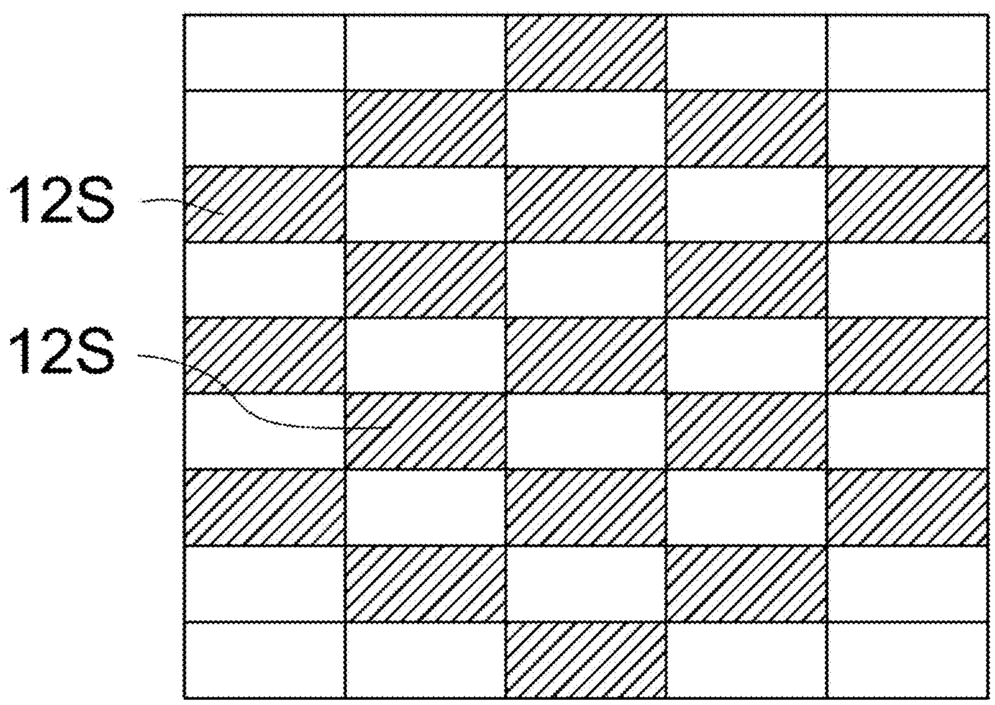
Figure 6B:
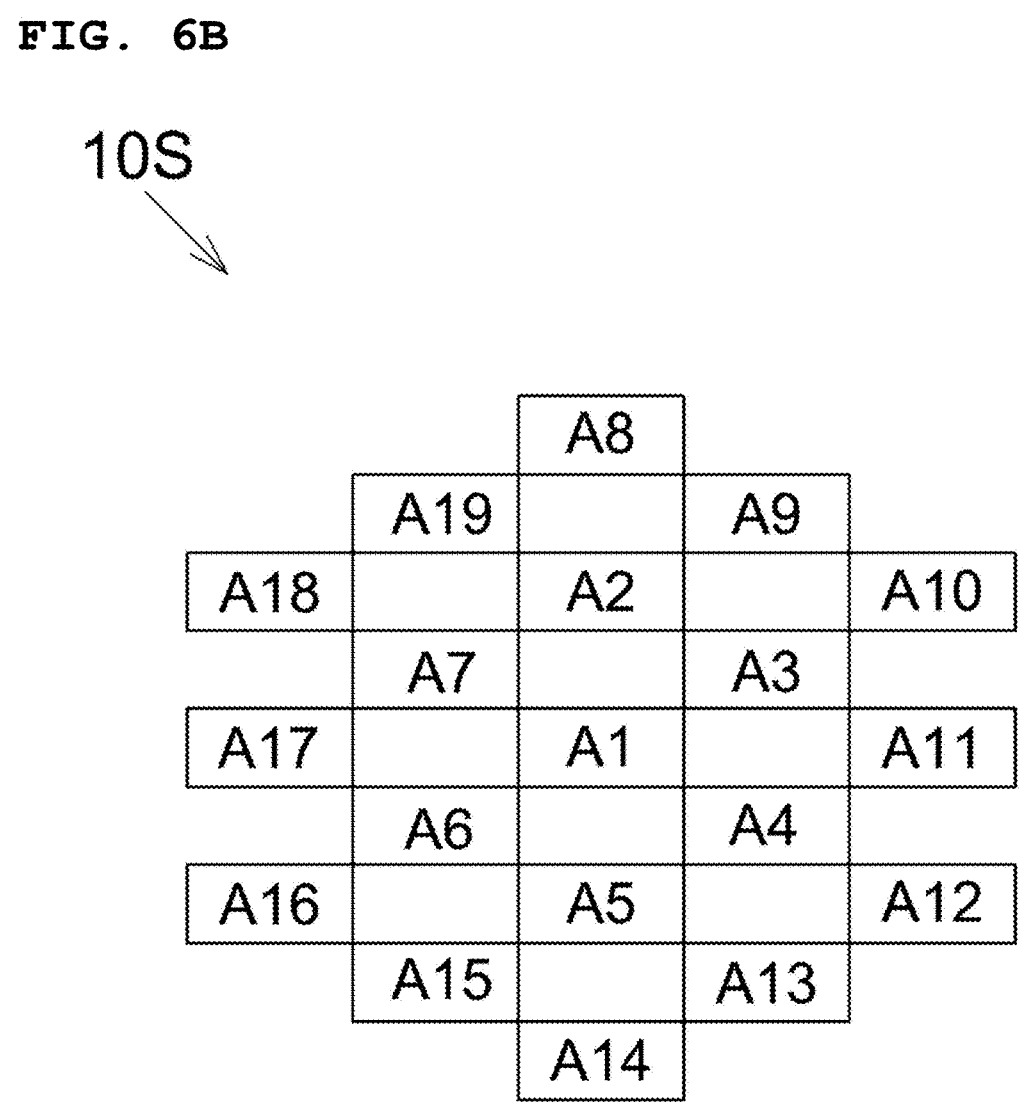

FIGS. 6A and 6B are conceptual diagrams of the light source model 10S of the heating light source unit 10 used in the simulation. FIG. 6A shows the positions of simulated light sources 12S with hatching. FIG. 6B is a diagram showing the explanatory codes A1 to A19 for each of the simulated light sources 12S.

Figure 7:
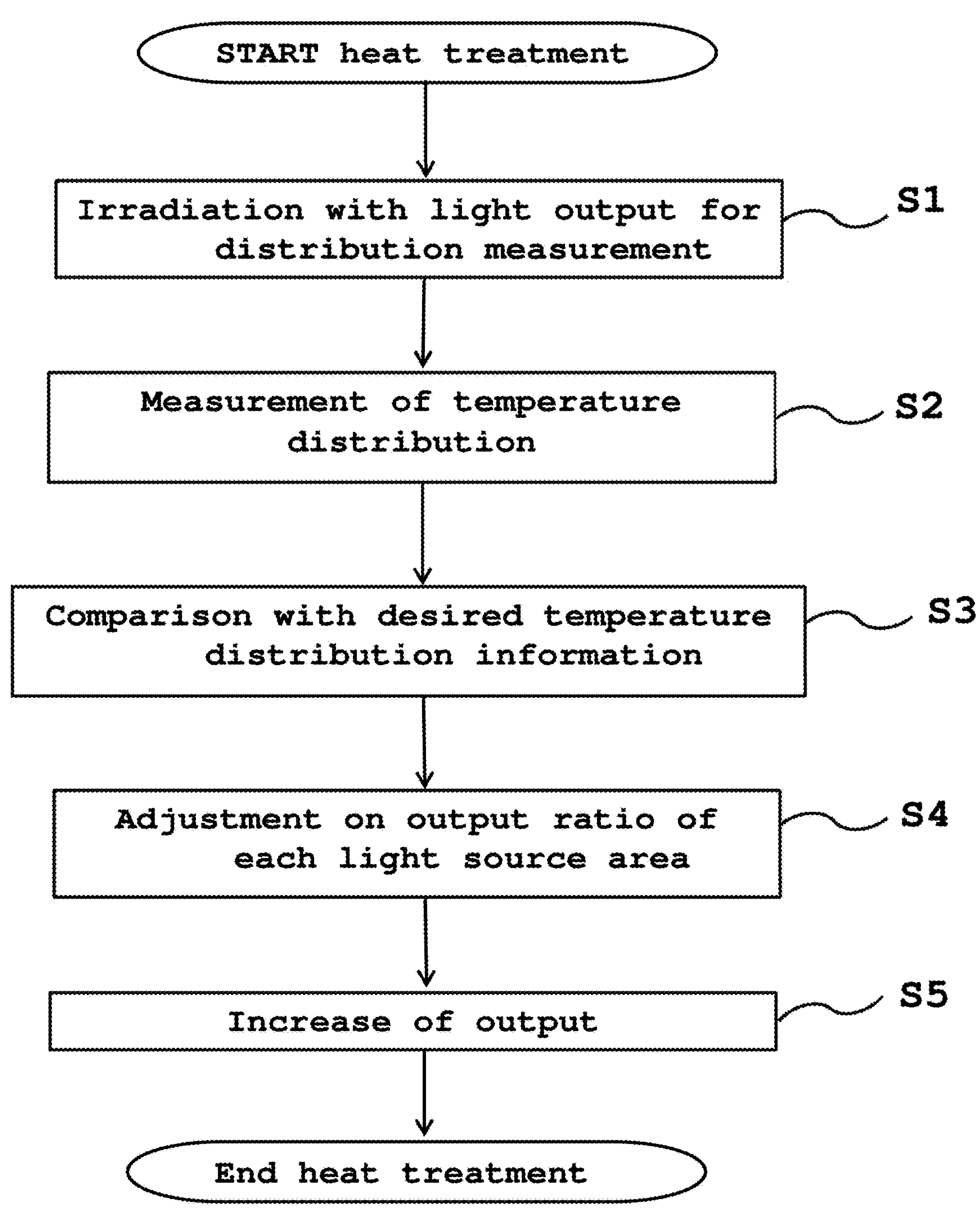
FIG. 7 is an example of a flowchart showing the procedure of heating an object to be heated 3 using the optical heating device 1.

When each of the simulated light sources A1 to A19 shown in FIG. 6B was lit in the lighting modes #1 to #12 listed in Table 1 below, the temperature distribution in the surface direction at a distance of 45 mm from the light source model 10S was calculated by simulation. The results are shown in FIG. 7.

TABLE 1

| Lighting modes | Lighting conditions |
|---|---|
| #1 | All at 100% output |
| #2 | Only A5 at 70% output, the others at 100% output |
| #3 | Only A5 and A6 at 70% output, the others at 100% output |
| #4 | Only A6 at 70% output, the others at 100% output |
| #5 | Only A5 at 100% output, the others at 0% output |
| #6 | Only A6 at 100% output, the others at 0% output |
| #7 | Only A1 at 100% output, the others at 0% output |
| #8 | Only A1, A5, and A6 at 100% output, the others at 0% output |
| #9 | Only A5 at 90% output, the others at 20% output |
| #10 | Only A6 at 90% output, the others at 20% output |
| #11 | Only A1 at 90% output, the others at 0% output |
| #12 | Only A1, A5, and A6 at 90% output, the others at 20% output |

In other words, in the optical heating device 1 of the present embodiment, the degree of influence on the temperature distribution of the main surface of the test piece is measured in advance when the relative value of the light output of the light source 12 is varied for each light source area 11 using the test piece. Hence, the temperature distribution characteristic information d1 as information reflecting this measurement result is stored in the storage section 22.

The output controller 21 controls the light output of each light source 12 mounted in the heating light source unit 10 per light source area 11. The output controller 21 is an arithmetic processing means that calculates the amount of current or voltage supplied to each light source area 11, and configured to include a CPU or MPU. The optical heating device 1 is provided with a power supply circuit, which is not shown in the figure. The power supply circuit supplies current or voltage to each light source area 11 to achieve the light output dP1 for each light source area 11 that is calculated by the output controller 21. As a result, each light source area 11 is lit under the output ratio determined by the output controller 21.

Hereinafter, the flow when using the optical heating device 1 will be explained with reference to FIG. 7. FIG. 7 is an example of a flowchart showing the procedure of heating an object to be heated 3 using the optical heating device 1.

Step S1

When the object to be heated 3 is placed in the chamber 30, the controller 20 first adjusts the light output of each light source 12 mounted by the heating light source unit 10 to a predetermined output (hereinafter referred to as "light output for distribution measurement"). The heating light source unit 10 irradiates the object to be heated 3 with the heating light L1 under the light output for distribution measurement. The object to be heated 3 is slightly heated by the heating light L1 under the light output for distribution measurement. Note that Step S1 is performed for the purpose of measuring the temperature distribution of the main surface 3*a* of the object to be heated 3 in the following Step S2. Hence, the light output for distribution measurement is set such that the object to be heated 3 is heated to a temperature much lower than the actual target heating temperature.

The light output for distribution measurement may be set, for example, to allow the relative output of the light sources 12 contained in all of the light source areas 11 to be the same. One specific example includes the output of light sources in all of the light source areas 11 is set to 10% of the maximum output thereof.

This Step S1 corresponds to the "first process".

Step S2

The thermal camera 41 measures the temperature distribution of the main surface 3*a* of the object to be heated 3. The measured temperature distribution information dT1 obtained by this measurement is input to the controller 20. This Step S2 corresponds to the "second process".

Step S3

The output controller 21 loads the desired temperature distribution information d2 from the storage section 22 and compares it with the measured temperature distribution information dT1 obtained in Step S2. Both of the information do not typically coincide with each other.

Step S4

Based on the S3 and the comparison results in Step temperature distribution characteristic information d1 loaded from the storage section 22, the output controller 21 calculates how the relative output ratio of each light source area 11 (more specifically, the relative output ratio of the light sources 12 included in each light source area 11) should be set in order to bring the measured temperature distribution information dT1 closer to the desired temperature distribution information d2.

As mentioned above, the temperature distribution characteristic information d1 describes the extent to which changing the relative output ratios among the respective light source areas 11 influences the temperature distribution on the main surface of the test piece. Hence, the comparison results of Step S3 and the temperature distribution characteristic information d1 make it possible to calculate the extent to which the relative output ratio of each light source area 11 is to be set.

Then, under the calculated relative output ratio of each light source area 11, the light sources 12 in each light source area 11 are lit.

Steps S3 to S4 correspond to the "third process".

Step S5

The output controller 21 increases the output of each light source 12 while maintaining the relative ratio set in Step S4. The heat treatment is completed when the temperature of the main surface 3*a* of the object to be heated 3 reaches the target temperature. The information on the target temperature may be input to the controller 20 by a user in advance using a terminal or the like at a time prior to the start of Step S5. This information on the target temperature is incorporated into the controller 20 via the input receiving section 23, and is stored in the storage section 22.

At this time, a second thermometer (not shown), which measures the temperature of a specific part of the main surface 3*a* of the object to be heated 3, may be used separately from the thermal camera 41. Examples of the second thermometer include a thermocouple or a radiation thermometer. When the first thermometer is a thermocouple or a radiation thermometer, the first thermometer and the second thermometer can be the same type of thermometers.

This Step S5 corresponds to the "fourth process".

As explained above, according to the optical heating device 1 of the present embodiment, the controller 20 automatically calculates and then adjusts the output of each light source 12 to allow the temperature distribution of the main surface 3*a* of the object to be heated 3 to become the temperature distribution desired by the user. This configuration makes it possible to accurately and automatically adjust the temperature distribution of the main surface 3*a* of the object to be heated 3 without relying on the user's experience or intuition.

When the optical heating device 1 is used to heat a large number of objects to be heated 3 that are placed sequentially in the chamber 30, the output ratio of each light source area 11 may be set based on the measured temperature distribution information dT1 that has already been measured. In other words, Steps S1 and S2 do not need to be performed every time the object to be heated 3 is placed in the chamber 30. In this case, Steps S3 to S5 are performed sequentially after the object to be heated 3 is placed in the chamber 30.

Another Embodiment

Hereinafter, another embodiment will be described.

<1> The temperature distribution characteristic information d1 stored in the storage section 22 may be described as information for each separation distance in the Z direction between the heating light source unit 10 and the test piece. In this case, when the number of light source areas 11 is n, and the number of kinds of light output of the light sources included in each light source area 11 is m, then $m^n$ kinds of temperature distribution characteristic information d1 are stored in the storage section 22 for each separation distance.

In this case, the separation distance in the Z direction between the object to be heated 3 and the heating light source unit 10 is measured in Step S1. Then, in Step S3, the output controller 21 loads the desired temperature distribution information d2 corresponding to the measured separation distance from the storage section 22 and compares it with the actual measured temperature distribution information dT1. Although this method increases the amount of information stored in the storage section 22, it enables the temperature distribution of the main surface 3*a* of the object to be heated 3 to be more accurately closer to the temperature distribution desired by the user.

<2> The number of light sources 12 included in each light source area 11 may be the same or may be different. In the former case, the relative ratio of the light output of the light sources 12 among the respective light source areas coincides with the relative ratio among the respective light source areas 11.

What is claimed is:

1. An optical heating device for heating a tabular object to be heated, the optical heating device comprising:

a heating light source unit having a plurality of light source areas, each of the light source areas being equipped with a plurality of light emitting diodes (LEDs) for emitting at least partially overlapping light towards the tabular object to be heated;

a controller for controlling light output of the light source located in each of the light source areas based on a list of predetermined modes, each of the modes specifying a set of light sources and a corresponding set of output values;

the controller including a storage section for storing the list of the predetermined modes, temperature distribution characteristic information describing a relation between a relative ratio of the light output of the light source among the light source areas and temperature distribution along a surface direction of a main surface of a tabular test piece, and desired temperature distribution information describing desired temperature distribution in a surface direction of a main surface of the object to be heated, when the light output from the heating light source unit is irradiated based upon the predetermined modes toward the tabular test piece placed with a predetermined separation distance from the light source areas with respect to a direction orthogonal to the light source surface;

an input receiving section for one of the predetermined modes, an input of measured temperature distribution information describing temperature distribution in the surface direction of the main surface of the object to be heated, the measured temperature distribution information being obtained when the light output from the heating light source unit is irradiated to the object to be heated in a state in which the light output of the light source is set to a predetermined light output for distribution measurement in each of the light source areas based upon one of the predetermined modes; and an output controller for determining one of the list of the predetermined modes for the light output of the light source among the light source areas based on the temperature distribution characteristic information, in order to bring the temperature distribution described in the measured temperature distribution information closer to the temperature distribution described in the desired temperature distribution information, wherein the controller repeats every one of the predetermined modes for the input receiving section and the output controller while compensating the effects of the overlapping light from the light source.

2. The optical heating device according to claim 1, wherein the storage section is configured to store the predetermined modes of m″ kinds for the temperature distribution characteristic information that has been obtained when the light output is varied in m kinds between a minimum output and a maximum output for each of the n light source areas formed in the heating light source unit, where m and n are both integers of 2 or more.

3. The optical heating device according to claim 1, wherein the light source areas include at least a first area that includes a central location of the light source surface and a second area that is located outside of the first area.

4. The optical heating device according to claim 3, wherein the second area is further divided into the plurality of light source areas along a circumferential direction of the light source surface.

5. The optical heating device according to claim 1, wherein after adjusting a ratio of the light output of the light source among the light source areas to allow the discrepancy between the temperature distribution described in the measured temperature distribution information and the temperature distribution described in the desired temperature distribution information to become equal to or less than a threshold value, the output controller controls the light output of the light source areas to increase from the light output for distribution measurement while maintaining the ratio the light output of the light source among the light source areas.

6. The optical heating device according to claim 1, wherein the desired temperature distribution information is information indicating that the main surface of the object to be heated has a substantially uniform temperature distribution in the surface direction thereof.

7. The optical heating device according to claim 1, further comprising a first thermometer that measures the temperature distribution in the surface direction of the main surface of the object to be heated, wherein the controller performs processes in sequence, the processes comprising:

a first process in which the output controller turns on the light source when the object to be heated is placed, in a state in which the light output of the light source is set to the light output for distribution measurement;

a second process in which the measured temperature distribution information is obtained when the first thermometer measures the temperature distribution in the surface direction of the main surface of the object to be heated at a time of executing the first process; and a third process in which the output controller varies a ratio of the light output of the light source among the light source areas in order to bring the temperature distribution described in the measured temperature distribution information closer to the temperature distribution described in the desired temperature distribution information, based on the temperature distribution characteristic information that has been loaded from the storage section, after executing the second process.

8. The optical heating device according to claim 7, further comprising a second thermometer that measures a temperature at a predetermined point on the main surface of the object to be heated, wherein the input receiving section is configured to receive an input of information regarding a target temperature of the main surface of the object to be heated, and the third process is a process in which the output controller adjusts a ratio of the light output of the light source among the light source areas in order to allow the discrepancy between the temperature distribution described in the measured temperature distribution information and the temperature distribution described in the desired temperature distribution information to be equal to or less than a threshold value, and the output controller is, after executing the third process, configured to execute a fourth process of increasing the light output of the plurality of light source areas from the light output for distribution measurement while maintaining the ratio adjusted in the third process in order to allow the temperature information indicated with the second thermometer to reach the target temperature.

9. The optical heating device according to claim 2, wherein the light source areas include at least a first area that includes a central location of the light source surface and a second area that is located outside of the first area.

10. The optical heating device according to claim 9, wherein the second area is further divided into the plurality of light source areas along a circumferential direction of the light source surface.

11. The optical heating device according to claim 2, wherein after adjusting a ratio of the light output of the light source among the light source areas to allow the discrepancy between the temperature distribution described in the measured temperature distribution information and the temperature distribution described in the desired temperature distribution information to become equal to or less than a threshold value, the output controller controls the light output of the light source areas to increase from the light output for distribution measurement while maintaining the ratio.

12. The optical heating device according to claim 2, wherein the desired temperature distribution information is information indicating that the main surface of the object to be heated has a substantially uniform temperature distribution in the surface direction thereof.

13. The optical heating device according to claim 2, further comprising a first thermometer that measures the temperature distribution in the surface direction of the main surface of the object to be heated, wherein the controller performs processes in sequence, the processes comprising:

a first process in which the output controller turns on the light source when the object to be heated is placed, in a state in which the light output of the light source is set to the light output for distribution measurement;

a second process in which the measured temperature distribution information is obtained when the first thermometer measures the temperature distribution in the surface direction of the main surface of the object to be heated at a time of executing the first process; and a third process in which the output controller varies a ratio of the light output of each light source among the light source areas in order to bring the temperature distribution described in the measured temperature distribution information closer to the temperature distribution described in the desired temperature distribution information, based on the temperature distribution characteristic information that has been loaded from the storage section, after executing the second process.

14. The optical heating device according to claim 13, further comprising a second thermometer that measures a temperature at a predetermined point on the main surface of the object to be heated, wherein the input receiving section is configured to receive an input of information regarding a target temperature of the main surface of the object to be heated, and the third process is a process in which the output controller adjusts the ratio of the light output of the light source among the light source areas in order to allow the discrepancy between the temperature distribution described in the measured temperature distribution information and the temperature distribution described in the desired temperature distribution information to be equal to or less than a threshold value, and the output controller is, after executing the third process, configured to execute a fourth process of increasing the light output of the plurality of light source areas from the light output for distribution measurement while maintaining the ratio adjusted in the third process in order to allow the temperature information indicated with the second thermometer to reach the target temperature.

* * * * *